US008995198B1

(12) United States Patent
Kathawala et al.

(10) Patent No.: US 8,995,198 B1
(45) Date of Patent: Mar. 31, 2015

(54) MULTI-PASS SOFT PROGRAMMING

(71) Applicant: Spansion LLC, Sunnyvale, CA (US)

(72) Inventors: Gulzar A. Kathawala, Campbell, CA (US); Mark W. Randolph, San Jose, CA (US); Yi He, Fremont, CA (US); Zhizheng Liu, San Jose, CA (US); Tio Wei Neo, Fremont, CA (US); Cindy Sun, San Jose, CA (US); Shivananda Shetty, San Jose, CA (US); Phuong Banh, San Ramon, CA (US); Richard Fastow, Cupertino, CA (US); Loi La, Cupertino, CA (US); Harry Hao Kuo, Palo Alto, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 14/050,490

(22) Filed: Oct. 10, 2013

(51) Int. Cl.
G11C 16/02 (2006.01)
G11C 16/12 (2006.01)
G11C 16/34 (2006.01)

(52) U.S. Cl.
CPC ............ G11C 16/12 (2013.01); G11C 16/3459 (2013.01); G11C 16/3409 (2013.01); G11C 16/3413 (2013.01)
USPC ............ 365/185.19; 365/185.09; 365/185.22; 365/185.24

(58) Field of Classification Search
CPC ........... G11C 16/3404; G11C 16/3413; G11C 16/344; G11C 16/3454; G11C 16/3459
USPC .............. 365/185.09, 185.19, 185.22, 185.24
See application file for complete search history.

(56) References Cited

U.S. PATENT DOCUMENTS

| 7,499,338 | B2 | | 3/2009 | Ito | |
|---|---|---|---|---|---|
| 8,767,477 | B2 | * | 7/2014 | Ueno et al. | 365/185.24 |
| 2003/0021155 | A1 | | 1/2003 | Yachareni et al. | |
| 2009/0034339 | A1 | | 2/2009 | Eguchi et al. | |
| 2010/0246260 | A1 | * | 9/2010 | Kang | 365/185.03 |
| 2011/0194353 | A1 | * | 8/2011 | Hwang et al. | 365/185.19 |
| 2011/0305081 | A1 | * | 12/2011 | Lee | 365/185.03 |
| 2012/0170373 | A1 | * | 7/2012 | Kim et al. | 365/185.19 |
| 2012/0287720 | A1 | * | 11/2012 | Choi | 365/185.19 |
| 2014/0063946 | A1 | * | 3/2014 | Mu et al. | 365/185.11 |

OTHER PUBLICATIONS

He, Chen, et al., "MPC56xx C90FL Flash Recovery In Case of Brownout during Flash Erase Operation," Application Note, Rev. 1, Doc No. AN4521, Freescale Semiconductor, Inc., United States (2012), 9 pages.

* cited by examiner

Primary Examiner — Tan T. Nguyen
(74) Attorney, Agent, or Firm — Sterne, Kessler, Goldstein & Fox P.L.L.C.

(57) ABSTRACT

Disclosed herein are system, method and computer program product embodiments for utilizing soft programming a nonvolatile memory. An embodiment operates by sequentially applying a single soft programming voltage pulse to all memory cells along each word line in the nonvolatile memory that fail soft programming verification in a first phase. This sequential application of the single soft programming voltage pulse in the first phase may repeat a predetermined number of times or until a threshold is met. Once the predetermined number of times completes, or the threshold is met, soft programming proceeds to a second phase where soft programming remains with each word line until all memory cells along the word line passes soft programming verification.

20 Claims, 6 Drawing Sheets

MULTI-PASS SOFT PROGRAMMING

BACKGROUND

Nonvolatile memory, such as flash memory, is a type of memory that retains stored data even after power is removed. To remove data from individual memory cells in an array of flash memory, sectors are erased, for example by creating a strong electric field between the charge-storing layer (such as a floating gate or silicon nitride layer) that causes the extraction of trapped electrons in the charge-storing layer of each memory cell. Sometimes, however, an erasure operation overshoots and causes some memory cells' threshold voltage $V_{th}$ to fall below an acceptable level. A low $V_{th}$ may cause excessive bit line current leakage that can result in subsequent read errors.

Soft programming provides a way of correcting the $V_{th}$ of these over-corrected memory cells. Soft programming applies voltage pulses that are lower than a programming voltage level across each word line that has one or more memory cells with a $V_{th}$ below a particular level. Soft programming may include the application of a high voltage on the drains of each cell via the bit lines during application of a soft programming pulse. This high voltage may cause the bit line current leakage to be much higher than the current leakage otherwise would be during verification. This higher current leakage may reduce the actual soft programming voltage pulse applied to the cells in two ways. First, the higher current may overload a charge pump that provides the programming pulse, thereby limiting the voltage the charge pump may supply. Second, the higher current results in a high IR (voltage) drop, which causes a lower voltage to be actually supplied to each cell. This increase in the bit line current leakage may cause soft programming to slow down significantly or even fail in extreme cases, even when verification is operating appropriately. The soft programming process remains at a given word line having memory cells with unacceptably low $V_{th}$ values until all memory cells in the word line are verified.

In situations where other over-corrected memory cells along later word lines cause bit line current leakage, the leakage may interfere with verification of the soft programming process at the given word line. This interference may also cause the overall soft programming process to either slow down, resulting in poor erase performance of the overall memory, or fail entirely. Further, bit line current leakage may cause the soft programming process to overshoot an ideal $V_{th}$ for the given word line, resulting in a smaller operating window and reduced reliability during regular programming.

SUMMARY

Provided herein are system, method and/or computer program product embodiments, and/or combinations and subcombinations thereof, for improving soft programming performance for a non-volatile memory.

An embodiment includes a computer implemented method for soft programming a memory array. The method operates by sequentially performing, by a controller, a first soft programming verification using a first verification level of cells along a plurality of word lines in a sector of the memory array, sequentially applying a single first voltage pulse to the plurality of word lines to cells that failed the soft programming verification, repeating the sequential application of the single first voltage pulse to the cells based on a determination to repeat, and repeating, after a determination not to repeat the sequential application, application of a second voltage pulse to each word line from among the plurality of word lines until each cell along each word line passes a second soft programming verification using a second verification level.

Another embodiment includes a system for soft programming a memory array. The apparatus includes a memory array sector, a memory, and at least one processor coupled to the memory. The processor is configured to sequentially perform a first soft programming verification using a first verification level of cells along the plurality of word lines in the memory array sector. The processor is also configured to sequentially apply a single first voltage pulse to the plurality of word lines to cells that failed the soft programming verification and repeat the sequential application of the single first verification voltage pulse to the plurality of word lines to the cells based on a determination to repeat. The processor is further configured to repeat, after a determination not to repeat the sequential application of the single first voltage pulse, application of a second voltage pulse to each word line from among the plurality of word lines until each cell along each word line passes a second soft programming verification using a second verification level.

A further embodiment includes a tangible computer-readable device having instructions stored thereon that, when executed by at least one computing device, cause the computing device to perform operations. The operations include sequentially performing a first soft programming verification using a first verification level of cells along a plurality of word lines in a sector of a memory array, sequentially applying a single first voltage pulse to the plurality of word lines to cells that failed the soft programming verification, repeating the sequential application of the single first voltage pulse to the plurality of word lines to the cells based on a determination to repeat, and repeating, after a determination not to repeat the sequential application, application of a second voltage pulse to each word line from among the plurality of word lines until each cell along each word line passes a second soft programming verification using a second verification level.

BRIEF DESCRIPTION OF THE DRAWINGS

The accompanying drawings are incorporated herein and form a part of the specification.

In the drawings, like reference numbers generally indicate identical or similar elements. Additionally, generally, the left-most digit(s) of a reference number identifies the drawing in which the reference number first appears.

DETAILED DESCRIPTION

Example Memory Array/Soft Programming System

Figure 1:
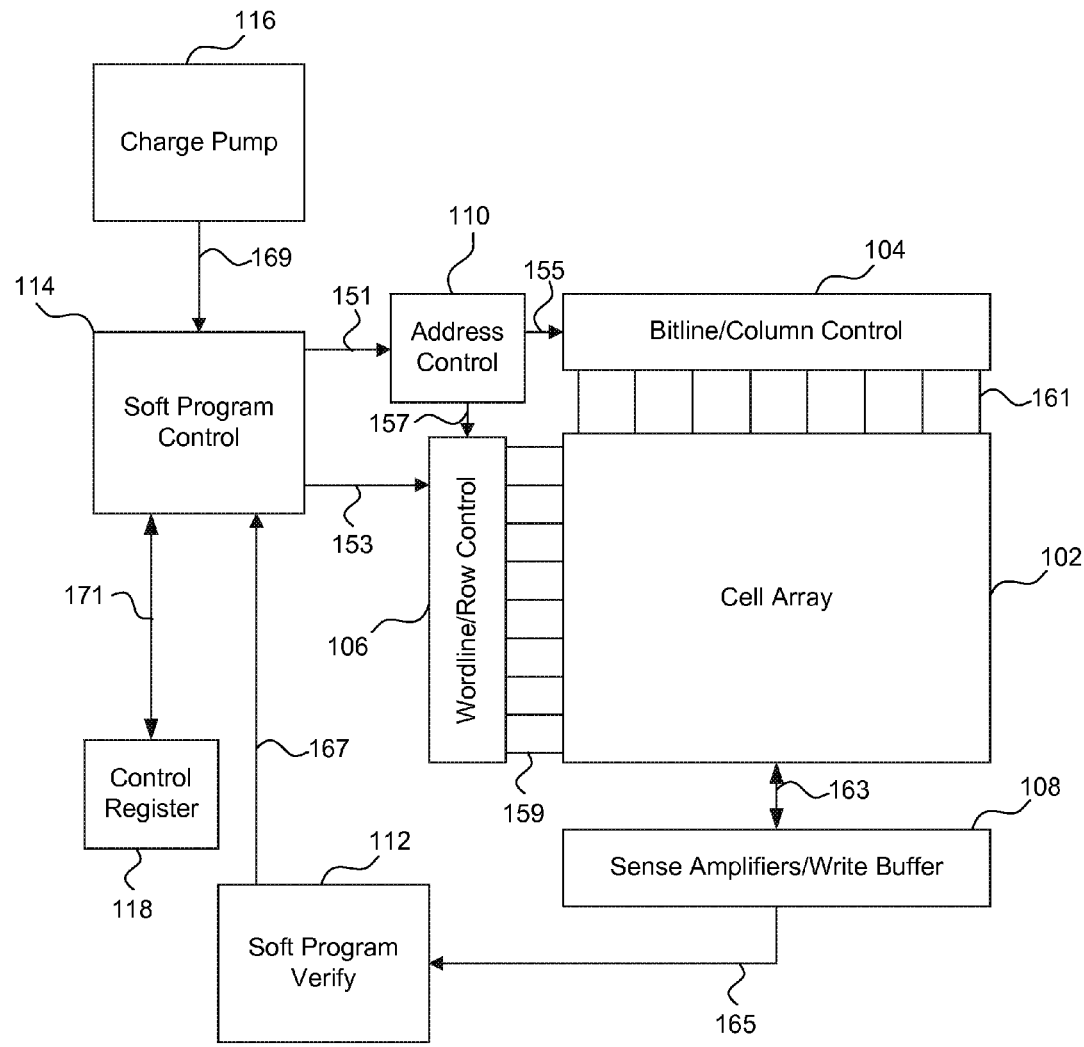
FIG. 1 is a block diagram of an exemplary soft program verification and programming system for a memory array, according to an example embodiment.

FIG. 1 is a block diagram of an exemplary memory array and soft programming system 100 that includes a cell array 102, a bit line (column) control module 104, a word line (row)

control module 106, a sense amplifier/write buffer module 108, an address control module 110, a soft program verify module 112, a soft program control module 114, a charge pump 116, and a control register 118. It should be noted that FIG. 1, as well as the rest of the figures of the present application, represent block diagrams of various aspects of the present application. Those skilled in the relevant art(s) will recognize that not all modules, as well as interconnections to and from all of the modules, are shown for sake of simplicity, but will be easily recognizable. The exemplary memory array and soft programming system 100 may be implemented, for example, in a NOR or a NAND flash memory system, but system 100 is not limited to these examples but is instead applicable to other memory systems/devices/circuits. The disclosure of this application will focus on the NOR configuration (including floating gate and dual bit (sold under the trademark MirrorBit®) implementations) for sake of simplicity and not limitation.

For purposes of this discussion unless otherwise stated or indicated, the term "module" shall be understood to include at least one of software, firmware, and hardware (such as one or more circuits, microchips, or devices, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

Returning to the disclosure of FIG. 1, the cell array 102 may include a plurality of flash memory cells (also referred to as bits). For example, the flash memory cells may be NOR flash memory. As will be appreciated by those skilled in the relevant art(s), the cell array 102 may be subdivided into sectors, blocks, and individual cells. The cell array 102 may include bit lines arranged in columns of the cell array 102. Each bit line may be connected, for example, to a drain of each individual cell arranged along the given bit line. The cell array 102 may also include word lines arranged in rows of the cell array 102. Each word line may be connected, for example, to a control gate of each individual cell arranged along the given word line. In this manner, each individual cell within the cell array 102 may be addressed and accessed (including, for example, writing and reading). By application of appropriate voltages 159 from the word line control module 106 to the word lines and appropriate voltages 161 to the bit lines from the bit line control module 104, each individual cell in the cell array 102 may be programmed, read, verified, erased, and/or soft-programmed.

To determine which individual cells in the cell array 102 to address and access, address control module 110 may receive an address for one or more memory cells in cell array 102 on address bus 151 from soft program control module 114. The soft program control module 114 may be, for example, a microcontroller. This address may be an individual address or a plurality of addresses. The address may include, for example, row address, column address, and sector select information. Additionally or alternatively, address control module 110 may receive the address from another bus in the system. The address control module 110 decodes the address and outputs column control signal 155 to the bit line control module 104 as well as row control signal 157 to the word line control module 106. Address control module 110 may be separate from, or integrated with, other controllers within the memory array and soft programming system 100.

The bit line control module 104 receives the column control signal 155 and outputs the column cell control signal(s) 161 based on the column control signal 155. The word line control module 106 receives the row control signal 157 and outputs the row cell control signal(s) 159 based on the row control signal 157 from the address control module 110. By application of appropriate voltages via the row cell control signal(s) 159 from the word line control module 106 to the word lines and appropriate voltages via the column cell control signal(s) 161 to the bit lines from the bit line control module 104, each individual cell in the cell array 102 may be programmed, read, verified, erased, and/or soft-programmed.

The sense amplifier/write buffer module 108 may be coupled to the cell array 102 and receive data output by the individual cells accessed by the corresponding row cell control signal(s) 159 and column cell control signal(s) 161 as input/output signal 163. The sense amplifier/write buffer module 108 may include, for example, sense amplifiers that receive data output by the accessed cell(s) from the cell array 102. The sense amplifier/write buffer module 108 may also include a write buffer that holds data to be written to one or more cells, blocks, and/or sectors within cell array 102.

The soft program control module 114 may conduct soft programming based on instructions stored within the control register 118, which are retrieved via memory path 171. Additionally or alternatively, the soft program control module 114 may include one or more registers or other memory. The control register 118 may be any type of hardware register as will be recognized by those skilled in the relevant art(s). The control register 118 may be any other type of memory, for example RAM, ROM, EEPROM, or other flash memory, as will be recognized by those skilled in the relevant art(s). In an embodiment, the soft program control module 114 may be capable of changing the instructions stored within control register 118.

During soft programming, the soft program control module 114 may apply a verification voltage via signal line 153 to the word line control module 106. The word line control module 106 may output, in a sequential manner per word line, the verification voltage via row cell control signal(s) 159. As each word line receives the verification voltage, a corresponding current is generated by individual cells along the subject word line. Alternatively, the soft program control module 114 may apply the verification voltage on a block or sector basis. The sense amplifier/write buffer module 108 may subsequently detect the current(s) generated by the verification voltage at each word line as the input/output signal 163.

The soft program verify module 112 may be configured to receive the detected current(s) from the input/output signal 163 as detected signal 165 from the sense amplifier/write buffer module 108. The detected signal 165 may be, for example, a drain current. The soft program verify module 112 may compare this detected signal 165 against a reference signal, for example a reference current or a reference voltage, to determine whether a $V_{th}$ of individual cells in the cell array 102 is within an appropriate range. The soft program verify module 112 may determine, for example, whether the $V_{th}$ of individual cells have fallen below a certain threshold.

The soft program verify module 112 may output a verification result signal 167, which the soft program control module 114 receives and uses to perform soft programming on individual cells within the cell array 102 that require soft programming. Based on the verification result signal 167, for example, the soft program control module 114 may output a low program voltage (for example, less than the level used for regular programming) via signal line 153. The word line control module 106 may receive the low program voltage and apply it to those cells along those word lines that have failed the verification, as will be discussed in more detail below. The voltages, such as the low program voltage and regular programming voltage, may be received from a charge pump 116 via voltage line 169.

Figure 2:
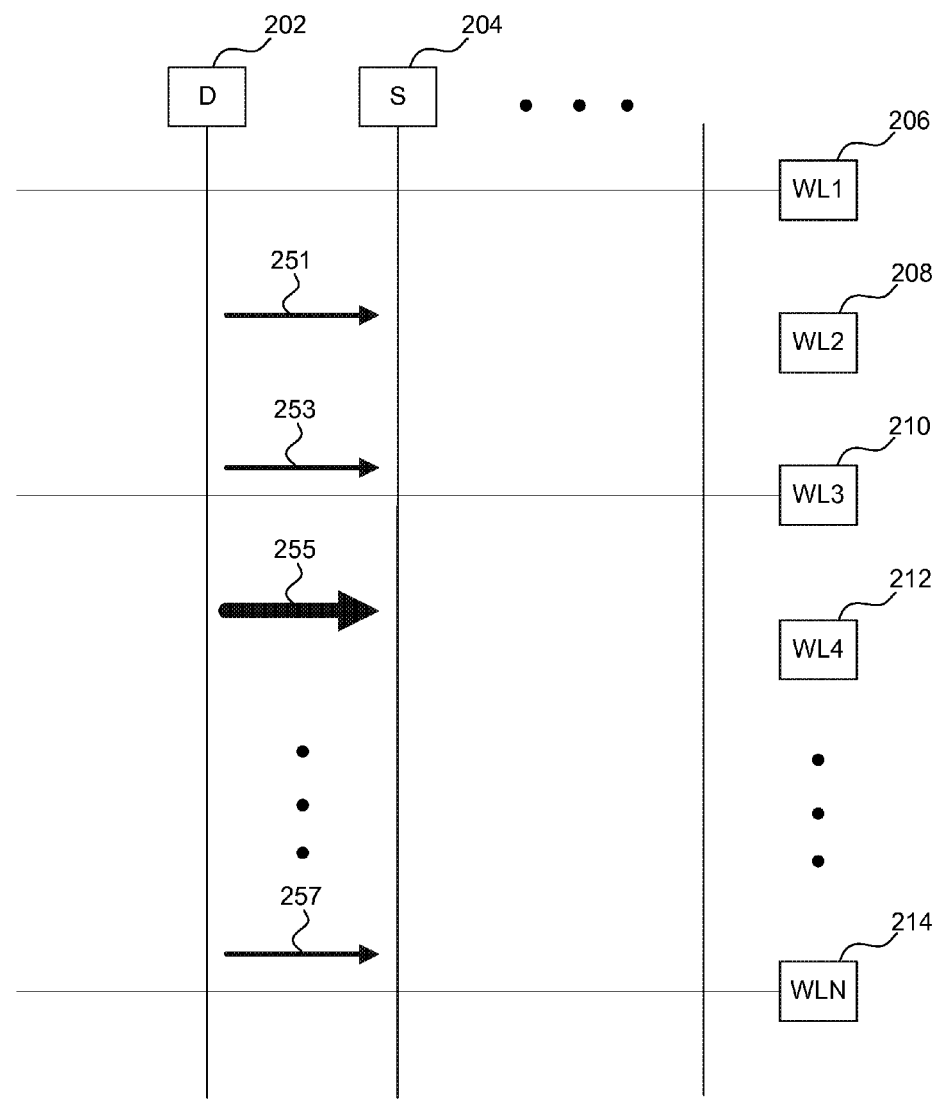
FIG. 2 is a block diagram illustrating exemplary bit line column leakage in a memory array.

FIG. 2 illustrates the need for soft programming as a block diagram showing exemplary bit line column leakage in a memory array 200. The memory array 200 may be, for example, a portion of the cell array 102 from FIG. 1. In FIG. 2, a plurality of word lines WL1, WL2, WL3, and WL4 through WLN are depicted as lines 206, 208, 210, 212, and 214, respectively. As shown, there may be N word lines in the memory array 200. Transverse to the word lines 206 through 214 are columns 202 and 204. Column 202 may be, for example, a bit line connected to the drain of an individual cell over which the bit line passes at each word line. Column 202 may illustrate the connection of the source of each individual cell to ground or some other voltage level.

After an erase operation on the memory array 200, a bit line column leakage may exist along the column 202, with each individual cell along each word line contributing a varying amount. For example, FIG. 2 illustrates an absence of leakage current for the cell on word line 206, a first small leakage current 251 for the cell on word line 208, a second small leakage current 253 for the cell on word line 210, a large leakage current 255 for the cell on word line 212, and a third small leakage current 257 for the cell on word line 214. According to an aspect of the present application that will be discussed in more detail below, the leakage current of varying size at each affected word line may be soft programmed so that the overall soft programming process does not time out or fail due to an excessively large leakage current at any particular cell.

For example, conventionally, soft programming would focus on correcting the $V_{th}$ of all individual cells along a first word line before proceeding to a subsequent word line. In FIG. 2, for example, soft programming would conventionally begin with correcting $V_{th}$ for the cell(s) on word line 208 to reduce or eliminate the first small leakage current 251 before proceeding to word line 210 and its associated second small leakage current 253. During conventional soft programming, a high voltage is typically applied on the drains of each cell via the bit lines during a soft programming voltage pulse. This high voltage may cause the current leakage to increase dramatically from what the current leakage otherwise would be during a subsequent verification operation. This higher current leakage may reduce the actual soft programming voltage pulse applied to the cells in two ways. First, the higher leakage current may overload a charge pump that provides the programming pulse, such as charge pump 116 for example, thereby limiting the voltage the charge pump may supply. Second, the higher current may result in a high IR (voltage) drop, which causes a lower voltage to be actually supplied to each cell. This increase in the current leakage may cause soft programming to slow down significantly or fail in extreme cases, even when subsequent verification operations are operating appropriately.

Further, in conventional soft programming verification operations, the soft programming may never reach subsequent word lines beyond the word line 208 because the parasitic currents resulting from leakage in memory cells along later word lines (such as large leakage current 255) may skew the bit line current detected by, for example, the sense amplifier/write buffer module 108. Conventionally, this could cause the system to hang on verifying the first word line to be soft programmed, such as word line 208, and never reach subsequent word lines with higher leakage currents. This could result in causing the soft programming process to time out and/or fail.

In accordance with an embodiment of the present application, however, a soft programming algorithm protects the process against timing out and/or failing by iteratively applying a single soft programming pulse sequentially to each word line that fails a verification test according to a test criterion as discussed in more detail with respect to FIGS. 4 and 5 below. The overall function of a soft programming algorithm according to an embodiment of the present application is first introduced by algorithm 300, which will be discussed with respect to FIG. 3, followed by a detailed discussion with respect to FIGS. 4 and 5.

Example Multi-Pass Soft Programming Algorithms

Figure 3:
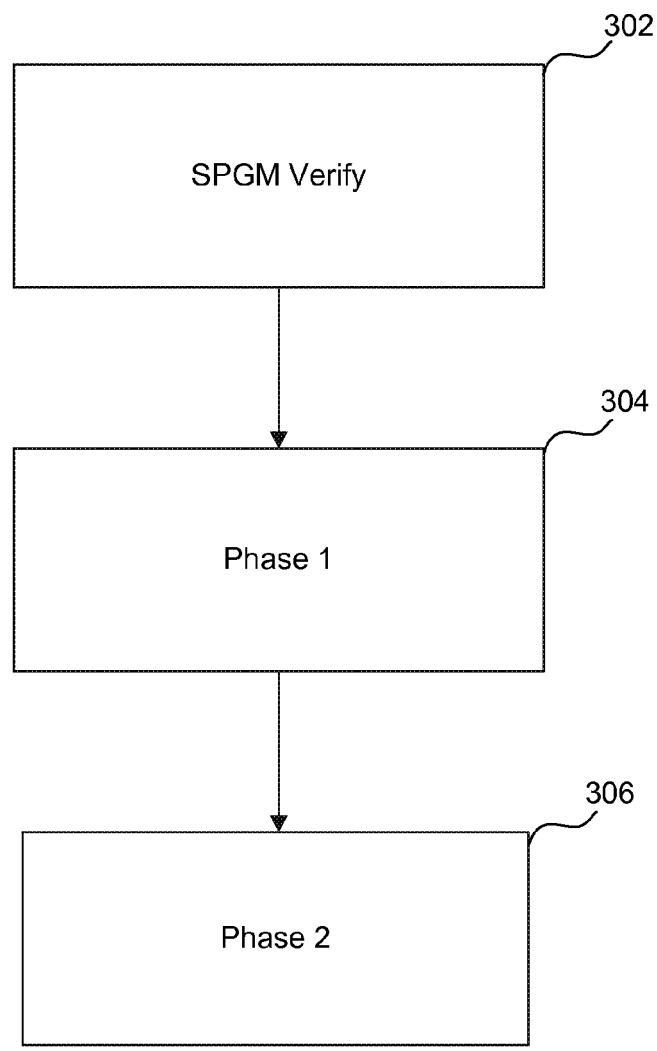
FIG. 3 is a flowchart illustrating a process for soft programming a memory array, according to an example embodiment.

FIG. 3 is a flowchart illustrating a process for soft programming a memory array, according to an example embodiment. The algorithm 300 may be applied, for example, to the cell array 102 of FIG. 1. Reference in the following discussion with respect to the algorithms of FIGS. 3-5 will be made to the system 100 from FIG. 1, although other types of arrays or sectors of arrays may be subject to the process as will be recognized by those skilled in the relevant art(s). The soft programming process begins in step 302, where verification begins with a first word line of the cell array 102. Alternatively, verification may be performed on an entire block or sector of the cell array 102 and the results stored for use in soft programming.

In step 304, phase 1 of soft programming according to an embodiment occurs. In phase 1, a single soft programming pulse at a first voltage level is applied to each cell per word line that failed verification. After a single pulse is applied to selected cells along a word line that failed verification, verification may be performed at the subsequent word line, and the subsequent word line may receive a single soft programming pulse as well. In one embodiment, therefore, the algorithm 300 may first perform verification and then apply the single pulse to each word line.

Alternatively, where verification is performed on an entire sector before any application of a single pulse, the algorithm 300 may use the results to apply the single pulse to each cell of the sector on each word line that failed verification. In this embodiment, application of the single pulse may still occur on a sequential, word line by word line basis. Either way, after verifying and applying the single pulse to each cell that requires it per word line, phase 1 is repeated for a number of passes as will be discussed in more detail below.

Soft programming of those cells that failed verification may be accomplished, for example, by the soft program control module 114 supplying address information along the address bus 151 to the address control module 110. The address control module 110 decodes the information to cause the word line control module 106 and the bit line control module 104 to output the appropriate control signal(s) 159 and 161, respectively, so that only those cells along a selected word line are activated by the column cell control signal(s) 161 to receive the soft programming pulse.

For step 304, the number of passes may be, but are not required to be, pre-determined or determined dynamically during the verification and soft programming process, for example by assessing whether a threshold for a selected attribute (such as voltage or current, as discussed in more detail below) has been met.

Step 304 ends after completing the determined number of passes, with the application of the single pulse to each requisite word line in each pass.

In step 306, phase 2 of soft programming begins according to an embodiment. In phase 2, soft programming begins at the first word line with cells that contribute to a leakage current, such as the first small leakage current 251 of FIG. 2. In some situations, the application of single pulses in phase 1 may have corrected the $V_{th}$ of some individual cells that had been over-erased. For those cells that were not sufficiently corrected, phase 1's application of the single, low pulses contributed in bringing the $V_{th}$ of individual cells closer to an acceptable range, thereby reducing corresponding leakage current.

In phase 2, soft programming repeats application of a soft programming voltage, at a second voltage level, along a given word line until all cells pass verification. The second voltage level in phase 2 may be different from the first voltage level for the single pulse in phase 1. For example, the second voltage level may be greater than the first voltage level. Alternatively, the second voltage level may be less than the first voltage level, or may be equal. Once all cells pass verification, the algorithm proceeds to a subsequent word line. Passing verification means that the $V_{th}$ for the cell(s) on the given word line are within the acceptable range before the algorithm 300 proceeds to the next word line.

In this manner, in phase 1 parasitic current is reduced at the various word lines in a memory array, such as cell array 102, before phase 2's soft programming of each word line until passing verification. This results in efficiently addressing column leakage across the cell array 102, thereby preventing soft programming timeout or over-soft programming individual cells of the array.

Figure 4:
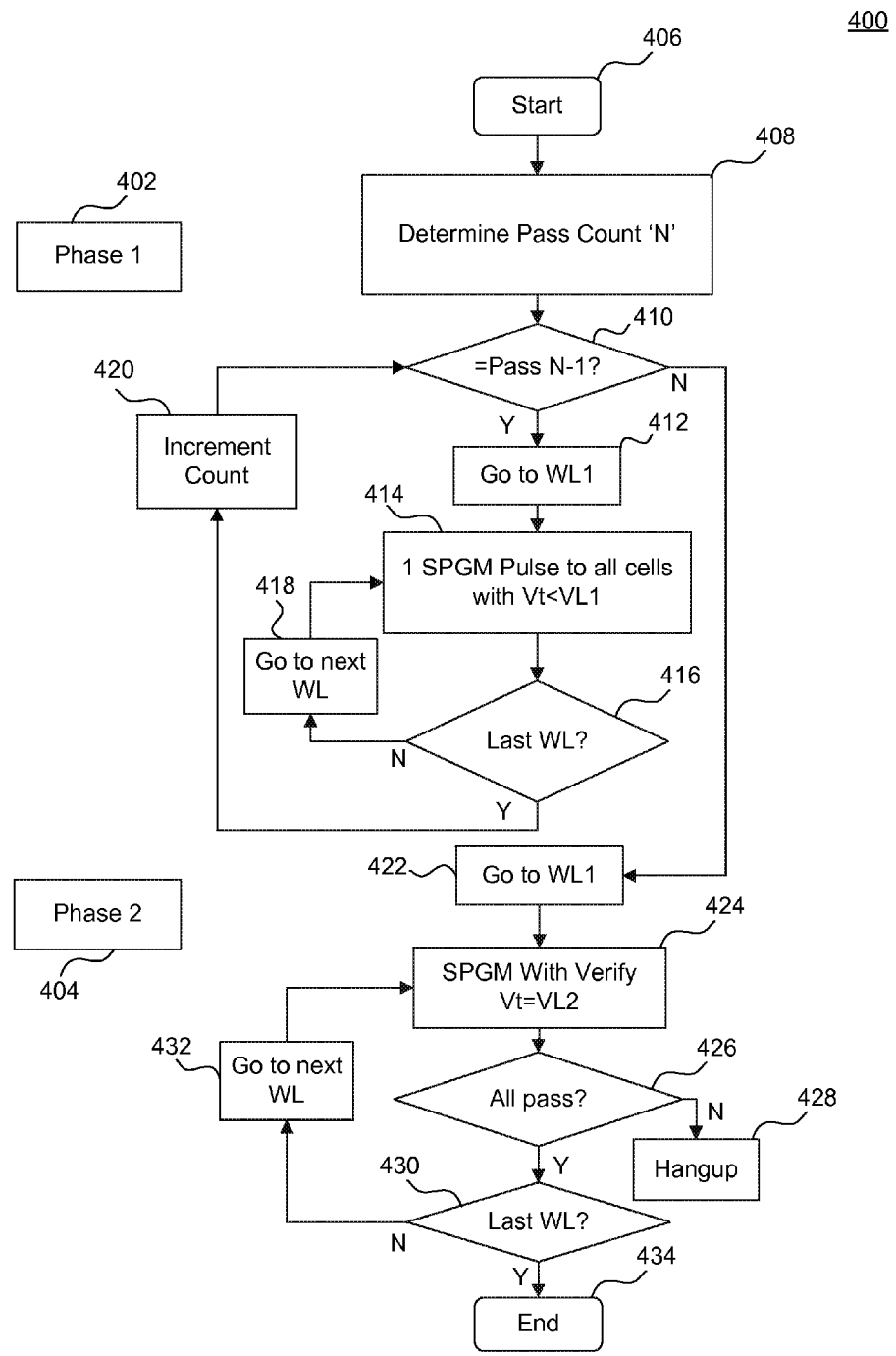
FIG. 4 is a flowchart illustrating a process for soft programming a memory array, according to an example embodiment.

FIG. 4 is a flowchart illustrating a more detailed process for soft programming a memory array, according to an example embodiment. Algorithm 400 may be, for example, an implementation of the algorithm 300.

Algorithm 400 starts at step 406. As discussed in FIG. 3, algorithm 400 includes phase 1, indicated by box 402 in FIG. 4, and phase 2, indicated by box 404.

In step 408, a pass count N is determined. Pass count N designates how many times the steps in phase 1 (402) will be repeated before proceeding to phase 2 (404). The pass count N may be determined, for example, by the soft program control module 114 depicted in FIG. 1. In addition, a pass counter variable may be initialized at zero to track the number of times phase 1 is repeated.

In one example, the pass count N is a preset value that may be programmed into memory at fabrication before operation, for example. In an alternative example, the pass count N may be calculated based on an attribute of the cell array 102 or a host device in which the cell array 102 resides. For example, the pass count N may be determined based on the number of program/erase (P/E) cycles that have already occurred at the sector. The pass count N may be a linear function of the P/E cycle count, or may have some other functional relationship with the P/E cycle count.

In another example, the pass count N may be a function of the amount of time required to erase the sector(s) of the cell array 102. The relationship between the erase time and pass count N may be linear, for example.

Once the pass count N has been determined, the algorithm 400 proceeds to decision step 410, where it is determined whether the pass counter variable equals pass count N−1 when the pass counter variable was initialized at zero. If the pass counter variable was initialized at one, it may be determined whether the pass counter variable equals pass count N, as will be recognized by those skilled in the relevant art(s). If the pass counter variable equals N−1 (or N, depending on how the pass counter variable was initialized), then the algorithm 400 proceeds to step 422 which ends phase 1 (402) and begins phase 2 (404).

If the pass counter variable is less than N−1, then the algorithm 400 proceeds to step 412, which begins soft programming at the first word line in the sector of the cell array 102 that requires soft programming.

In step 414, a single voltage pulse at a first voltage level, $V_{SP1}$, may be applied to those cells along the word line that fail verification using a first verification level $V_{L1}$, for example where $V_{th} < V_{L1}$.

In decision step 416, the algorithm 400 determines whether the word line that has just received the soft programming pulse $V_{SP1}$ is the last word line in the sector. If it was not the last word line, then in step 418 the algorithm 400 proceeds to the next word line and loops back to step 414 to apply the soft programming pulse $V_{SP1}$ to the next word line.

If at decision step 416 it is determined that the last word line in the sector was just soft programmed, then the algorithm 400 increments the pass counter variable in step 420. The algorithm 400 then proceeds again to the decision step 410, where the pass counter is compared against pass count N−1 (or N, depending on how the pass counter variable was initialized). Depending on the result of the comparison, phase 1 (402) either continues or the algorithm 400 moves to phase 2 (404) and step 422, as discussed above.

In step 422, phase 2 (404) begins with the algorithm 400 beginning soft programming at the first word line in the sector of the cell array 102 that requires soft programming.

In step 424, a soft programming voltage at a second voltage level, $V_{SP2}$, may be applied to those cells along the word line that fail verification using a second verification level $V_{L2}$, until $V_{th} = V_{L2}$ or approximately does. The second voltage level $V_{SP2}$ may be different then the first voltage level $V_{SP1}$ used in phase 1 (402) or may be the same. Similarly, the second verification level $V_{L2}$ may be a different value than the first verification level $V_{L1}$ used in phase 1 (402) or may be the same.

In decision step 426, the algorithm 400 determines whether all of the cells along the given current word line pass verification (for example where $V_{th} = V_{L2}$). If all of the cells do not pass verification in phase 2 (404), then the algorithm 400 proceeds to step 428, where soft programming ends prematurely due to a persistent verification failure of one or more of the cells along the given word line. Alternatively, algorithm 400 may repeat soft programming in phase 2 (404) (not shown in FIG. 4) at the given word line a pre-determined number of times M, checking after each repetition whether all of the cells along the given word line pass verification. In addition, after each repetition the soft programming voltage may increase above $V_{SP2}$ a fixed amount.

If all cells along the given word line pass verification, then the algorithm 400 proceeds to decision step 430, where it is determined whether the word line that has just been soft programmed is the last word line in the sector.

If it was not the last word line, then in step 432 the algorithm 400 proceeds to the next word line and loops back to step 424 to soft program the next word line as discussed with respect to steps 424 and 426. If it was the last word line, then algorithm 400 proceeds to step 434 and ends soft programming.

Figure 5:
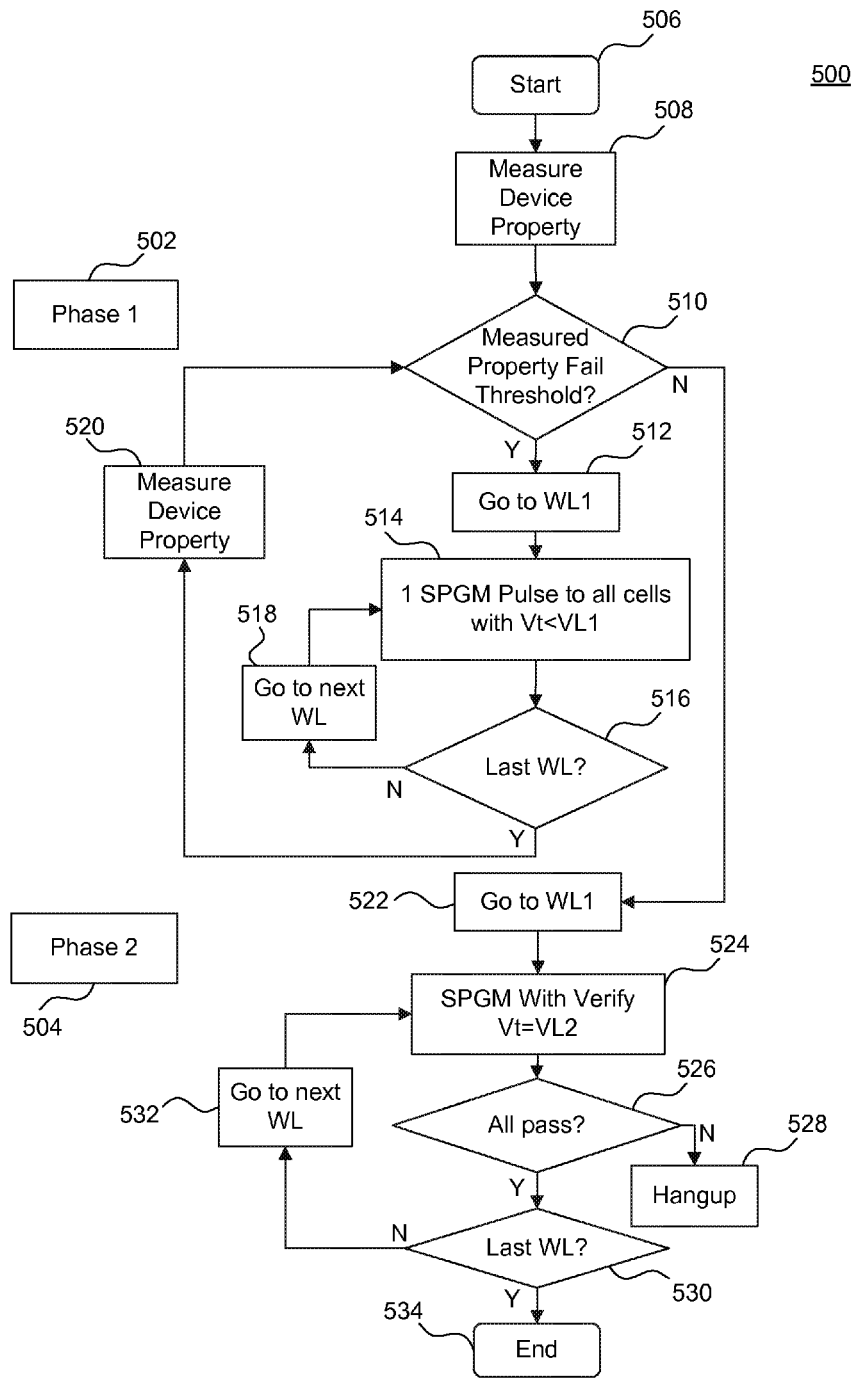
FIG. 5 is a flowchart illustrating a process for soft programming a memory array, according to an alternative example embodiment.

FIG. 5 is a flowchart illustrating a more detailed process for soft programming a memory array, according to an alternative example embodiment. Algorithm 500 may be, for example, an alternative implementation of the algorithm 300.

Algorithm 500 starts at step 506. As discussed in FIG. 3, algorithm 500 includes phase 1, indicated by box 502 in FIG. 5, and phase 2, indicated by box 504.

In step 508, a device property is measured. The measured device property may serve as a variable for comparison in a loop, such as a while loop, that is repeated in phase 1 (502) until a criterion is met. In one example, the device property measured may be leakage current on the columns of the cell array 102. In another example, the device property may be the threshold voltage $V_{th}$ of cells of the cell array 102. In another example, the device property may be whether the cells pass or fail a low verification voltage, for example a verification voltage that is less than the soft programming verification voltage used in phase 1 (502).

Once the device property has been measured in step 508, the algorithm 500 proceeds to decision step 510, where the measured device property is compared against, for example, a threshold such as those discussed below. The threshold may be pre-programmed, such as into a memory or hardware device used for controlling the cell array 102. Alternatively, the threshold may be programmable during operation of the cell array 102 by a user or other source. In one example, if the measured device property is at or above the threshold, then the algorithm 500 proceeds to step 522 which ends phase 1 (502) and begins phase 2 (504). In an alternative example, if the measured device property is at or below the threshold, then the algorithm 500 proceeds to step 522.

In one example, if the leakage current for any of the columns is above a threshold, or greater than or equal to the threshold, then the algorithm 500 continues to step 512 in phase 1 (502). If the leakage current is less than, or equal to or less than the threshold in another example, then the algorithm 500 continues to step 522 and begins phase 2 (504). For example, the threshold may be set to be 2 µA. Other threshold values are possible, as will be recognized by those skilled in the relevant art(s).

In an alternative example, the system may measure a device property by applying a low voltage $V_{LOW}$, for example lower than the soft programming verify voltage level $V_{L1}$ used in phase 1 (502) of the algorithm 500, to each word line. This low voltage $V_{LOW}$ may be, for example, 1V. In step 510, if any cells in the cell array 102 fail the $V_{LOW}$ voltage application, then the algorithm 500 continues to step 512 in phase 1 (502). If none of the cells in the cell array 102 fail the $V_{LOW}$ voltage application, then the algorithm 500 continues to step 522 and begins phase 2 (504).

In an additional alternative example, the system may measure directly or indirectly the threshold voltage $V_{th}$ of all cells within the cell array 102 or any sector thereof. In one example, when the $V_{th}$ of any given cell within the sector of the cell array 102 is less than a threshold value at step 510, the algorithm will continue to step 512 in phase 1 (502). If none of the cells in the sector of the cell array 102 are less than $V_{th}$ then the algorithm 500 continues to step 522 and begins phase 2 (504). Alternatively, when the $V_{th}$ of any given cell, or a minimum number of cells, is less than a given value the algorithm 500 may determine a fixed pass count N. Where $V_{th}$ may be used to set the pass count N, the algorithm 500 would then proceed as discussed above with respect to algorithm 400.

As will be recognized by those skilled in the relevant art(s), there are other ways in which to modify the above measurement and comparison steps to determine whether, and/or how many times, to repeat application of the single pulse in phase 1 (502) to every necessary cell along each word line in the sector of the cell array 102.

If it is determined at step 510 that phase 1 (502) should continue, then the algorithm 500 proceeds to step 512, which begins soft programming at the first word line in the sector of the cell array 102 that requires soft programming.

In step 514, a single voltage pulse at a first voltage level, $V_{SP1}$, may be applied to those cells along the word line that fail verification using a first verification level $V_{L1}$, for example where $V_{th}<V_{L1}$.

In decision step 516, the algorithm 500 determines whether the word line that has just received the soft programming pulse $V_{SP1}$ is the last word line in the sector. If it was not the last word line, then in step 518 the algorithm 500 proceeds to the next word line and loops back to step 514 to apply the soft programming pulse $V_{SP1}$ to the next word line.

If at decision step 516 it is determined that the last word line in the sector was just soft programmed, then the algorithm 500 measures the device property again in step 520. The algorithm 500 then proceeds again to the decision step 510, where the measured device property is compared against the threshold. Depending on the result of the comparison, phase 1 (502) either continues or the algorithm 500 moves to phase 2 (504), as discussed above.

In step 522, phase 2 (504) begins with the algorithm 500 beginning soft programming at the first word line in the sector of the cell array 102 that requires soft programming.

In step 524, a soft programming voltage at a second voltage level, $V_{SP2}$, may be applied to those cells along the word line that fail verification using a second verification level $V_{L2}$, until $V_{th}=V_{L2}$ or approximately does. The second voltage level $V_{SP2}$ may be different then the first voltage level $V_{SP1}$ used in phase 1 (502) or may be the same. Similarly, the second verification level $V_{L2}$ may be a different value than the first verification level $V_{L1}$ used in phase 1 (502) or may be the same.

In decision step 526, the algorithm 500 determines whether all of the cells along the given current word line pass verification (for example where $V_{th}=V_{L2}$). If all of the cells do not pass verification in phase 2 (504), then the algorithm 500 proceeds to step 528, where soft programming ends prematurely due to a persistent verification failure of one or more of the cells along the given word line. Alternatively, algorithm 500 may repeat soft programming in phase 2 (504) (not shown in FIG. 4) at the given word line a pre-determined number of times M, either checking after each repetition whether all of the cells along the given word line pass verification or simply repeating M times. In addition, after each repetition the soft programming voltage may increase above $V_{SP2}$ a fixed amount.

If all cells along the given word line pass verification, then the algorithm 500 proceeds to decision step 530, where it is determined whether the word line that has just been soft programmed is the last word line in the sector.

If it was not the last word line, then in step 532 the algorithm 500 proceeds to the next word line and loops back to step 524 to soft program the next word line as discussed with respect to steps 524 and 526. If it was the last word line, then algorithm 500 proceeds to step 534 and ends soft programming.

Example Computer System

Figure 6:
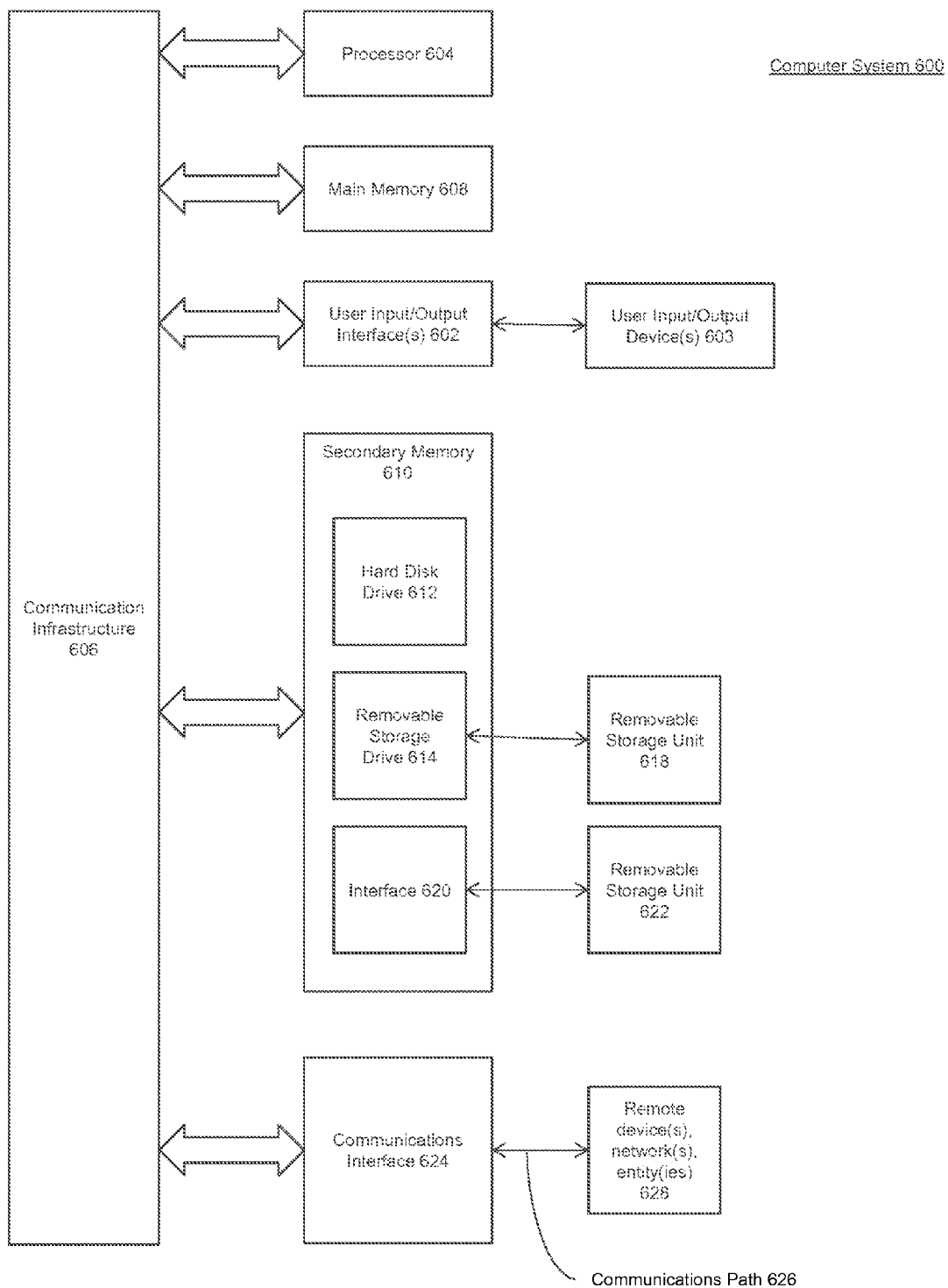
FIG. 6 is an example computer system useful for implementing various embodiments.

Various embodiments can be implemented, for example, using one or more well-known computer systems, such as computer system 600 shown in FIG. 6. Computer system 600 can be any well-known computer capable of performing the functions described herein, such as computers available from International Business Machines, Apple, Sun, HP, Dell, Sony, Toshiba, etc.

Computer system 600 includes one or more processors (also called central processing units, or CPUs), such as a processor 604. Processor 604 is connected to a communication infrastructure or bus 606.

One or more processors 604 may each be a graphics processing unit (GPU). In an embodiment, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 600 also includes user input/output device(s) 603, such as monitors, keyboards, pointing devices, etc., which communicate with communication infrastructure 606 through user input/output interface(s) 602.

Computer system 600 also includes a main or primary memory 608, such as random access memory (RAM). Main memory 608 may include one or more levels of cache. Main memory 608 has stored therein control logic (i.e., computer software) and/or data.

Computer system 600 may also include one or more secondary storage devices or memory 610. Secondary memory 610 may include, for example, a hard disk drive 612 and/or a removable storage device or drive 614. Removable storage drive 614 may be a floppy disk drive, a magnetic tape drive, a compact disk drive, an optical storage device, tape backup device, and/or any other storage device/drive.

Removable storage drive 614 may interact with a removable storage unit 618. Removable storage unit 618 includes a computer usable or readable storage device having stored thereon computer software (control logic) and/or data. Removable storage unit 618 may be a floppy disk, magnetic tape, compact disk, DVD, optical storage disk, and/any other computer data storage device. Removable storage drive 614 reads from and/or writes to removable storage unit 618 in a well-known manner.

According to an exemplary embodiment, secondary memory 610 may include other means, instrumentalities or other approaches for allowing computer programs and/or other instructions and/or data to be accessed by computer system 600. Such means, instrumentalities or other approaches may include, for example, a removable storage unit 622 and an interface 620. Examples of the removable storage unit 622 and the interface 620 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 600 may further include a communication or network interface 624. Communication interface 624 enables computer system 600 to communicate and interact with any combination of remote devices, remote networks, remote entities, etc. (individually and collectively referenced by reference number 628). For example, communication interface 624 may allow computer system 600 to communicate with remote devices 628 over communications path 626, which may be wired and/or wireless, and which may include any combination of LANs, WANs, the Internet, etc. Control logic and/or data may be transmitted to and from computer system 600 via communication path 626.

In an embodiment, a tangible apparatus or article of manufacture comprising a tangible computer useable or readable medium having control logic (software) stored thereon is also referred to herein as a computer program product or program storage device. This includes, but is not limited to, computer system 600, main memory 608, secondary memory 610, and removable storage units 618 and 622, as well as tangible articles of manufacture embodying any combination of the foregoing. Such control logic, when executed by one or more data processing devices (such as computer system 600), causes such data processing devices to operate as described herein.

Based on the teachings contained in this disclosure, it will be apparent to persons skilled in the relevant art(s) how to make and use the invention using data processing devices, computer systems and/or computer architectures other than that shown in FIG. 6. In particular, embodiments may operate with software, hardware, and/or operating system implementations other than those described herein.

CONCLUSION

It is to be appreciated that the Detailed Description section, and not the Summary and Abstract sections, is intended to be used to interpret the claims. The Summary and Abstract sections may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A computer implemented method for soft programming a memory array, comprising:

sequentially performing, by a controller, a first soft programming verification using a first verification level of cells along a plurality of word lines in a sector of the memory array;
sequentially applying a single first voltage pulse to the plurality of word lines to cells that failed the soft programming verification;
repeating the sequential application of the single first voltage pulse to the plurality of word lines to the cells based on a determination to repeat; and
repeating, after a determination not to repeat the sequential application, application of a second voltage pulse to each word line from among the plurality of word lines until each cell along each word line passes a second soft programming verification using a second verification level.

2. The method of claim 1, wherein a value of the single first voltage pulse is different from a value of the second voltage pulse and the first verification level is different from the second verification level.

3. The method of claim 1, wherein the determination to repeat comprises:
selecting a pass count that specifies how many times to repeat the sequential application of the single first voltage pulse to the plurality of word lines; and
incrementing a count variable after every sequential application of the single first voltage pulse;
wherein the determination not to repeat comprises the count variable equaling the pass count.

4. The method of claim 1, wherein the determination to repeat comprises:
comparing, by the controller, a measured column leakage current against a current threshold; and
determining to repeat the sequential application of the single first voltage pulse while the measured column leakage current is greater than or equal to the current threshold.

5. The method of claim 1, wherein the determination to repeat comprises:
determining a pass count that specifies how many times to repeat the sequential application of the single first voltage pulse to the plurality of word lines based on a number of program/erase cycles for the sector; and
incrementing a count variable after every sequential application of the single first voltage pulse;
wherein the determination not to repeat comprises the count variable equaling the pass count.

6. The method of claim 5, the determining the pass count further comprising:
determining the pass count based on a linear relationship to the number of program/erase cycles for the sector.

7. The method of claim 1, wherein the determination to repeat comprises:
comparing a threshold voltage of the cells along the plurality of word lines against a minimum voltage value; and
determining to repeat the sequential application of the single first voltage pulse while the threshold voltage of any of the cells along the plurality of word lines is less than or equal to the minimum voltage value.

8. The method of claim 1, wherein the determination to repeat comprises:
determining to repeat the sequential application of the single first voltage pulse while the cells along the plurality of word lines in the sector fail a third verification level, wherein the third verification level is less than the first verification level.

9. A system, comprising:
a memory array sector comprising a plurality of word lines;
a memory; and
at least one processor coupled to the memory and configured to:
sequentially perform a first soft programming verification using a first verification level of cells along the plurality of word lines in the memory array sector;
sequentially apply a single first verification voltage pulse to the plurality of word lines to cells that failed the soft programming verification;
repeat the sequential application of the single first verification voltage pulse to the plurality of word lines to the cells based on a determination to repeat; and
repeat, after a determination not to repeat the sequential application of the single first voltage pulse, application of a second verification voltage pulse to each word line from among the plurality of word lines until each cell along each word line passes a second soft programming verification using a second verification level.

10. The system of claim 9, further comprising:
a charge pump configured to provide the first verification level as a first voltage, the second verification level as a second voltage, the single first voltage pulse, and the second voltage pulse.

11. The system of claim 9, wherein a value of the single first voltage pulse is different from a value of the second voltage pulse and the first verification level is different from the second verification level.

12. The system of claim 9, wherein to perform the determination to repeat the at least one processor is configured to:
select a pass count that specifies how many times to repeat the sequential application of the single first voltage pulse to the plurality of word lines; and
increment a count variable after every sequential application of the single first voltage pulse;
wherein the determination not to repeat comprises the count variable equaling the pass count.

13. The system of claim 9, wherein to perform the determination to repeat the at least one processor is configured to:
compare a measured column leakage current against a current threshold; and
determine to repeat the sequential application of the single first voltage pulse while the measured column leakage current is greater than or equal to the current threshold.

14. The system of claim 9, wherein to perform the determination to repeat the at least one processor is configured to:
determine a pass count that specifies how many times to repeat the sequential application of the single first voltage pulse to the plurality of word lines based on a number of program/erase cycles for the sector; and
increment a count variable after every sequential application of the single first voltage pulse;
wherein the determination not to repeat comprises the count variable equaling the pass count.

15. The system of claim 9, wherein to perform the determination to repeat the at least one processor is configured to:
determine to repeat the sequential application of the single first voltage pulse while the cells along the plurality of word lines in the memory array sector fail a third verification level,
wherein the third verification level is less than the first verification level.

16. A tangible computer-readable device having instructions stored thereon that, when executed by at least one computing device, causes the at least one computing device to perform operations comprising:

sequentially performing a first soft programming verification using a first verification level of cells along a plurality of word lines in a sector of a memory array;

sequentially applying a single first voltage pulse to the plurality of word lines to cells that failed the soft programming verification;

repeating the sequential application of the single first voltage pulse to the plurality of word lines to the cells based on a determination to repeat; and repeating, after a determination not to repeat the sequential application, application of a second voltage pulse to each word line from among the plurality of word lines until each cell along each word line passes a second soft programming verification using a second verification level.

17. The computer-readable device of claim 16, the determination to repeat comprising:

selecting a pass count that specifies how many times to repeat the sequential application of the single first voltage pulse to the plurality of word lines; and incrementing a count variable after every sequential application of the single first voltage pulse;

wherein the determination not to repeat comprises the count variable equaling the pass count.

18. The computer-readable device of claim 16, the determination to repeat comprising:

comparing a measured column leakage current against a current threshold; and determining to repeat the sequential application of the single first voltage pulse while the measured column leakage current is greater than or equal to the current threshold.

19. The computer-readable device of claim 16, the determination to repeat comprising:

determining a pass count that specifies how many times to repeat the sequential application of the single first voltage pulse to the plurality of word lines based on a number of program/erase cycles for the sector; and incrementing a count variable after every sequential application of the single first voltage pulse;

wherein the determination not to repeat comprises the count variable equaling the pass count.

20. The computer-readable device of claim 16, the determination to repeat comprising:

determining to repeat the sequential application of the single first voltage pulse while the cells along the plurality of word lines in the sector fail a third verification level, wherein the third verification level is less than the first verification level.

* * * * *